United States Patent [19]
Kadouchi et al.

[11] Patent Number: 5,675,258
[45] Date of Patent: Oct. 7, 1997

[54] APPARATUS FOR DETECTING BATTERY PACK DETERIORATION DURING DISCHARGE MODE AND METHOD FOR INHIBITING DETERIORATION DETECTION OF A SIGNIFICANTLY DRAINED BATTERY PACK DURING CHARGING MODE

[75] Inventors: Eiji Kadouchi, Hirakata; Yuichi Watanabe, Tokyo-to; Megumi Kinoshita, Fujisawa; Noboru Ito, Kadoma; Kanji Takata, Neyagawa, all of Japan

[73] Assignee: Matsushita Electric Industry Co., Ltd., Osaka-Fu, Japan

[21] Appl. No.: 554,118

[22] Filed: Nov. 6, 1995

[30] Foreign Application Priority Data

Nov. 8, 1994 [JP] Japan ................... 6-273457

[51] Int. Cl.[6] ............................. G01N 27/416
[52] U.S. Cl. ................. 324/433; 324/427; 324/431; 340/636; 320/48
[58] Field of Search ................. 324/426, 427, 324/428, 429, 431, 433, 435; 320/32, 43, 44, 48; 340/636; 364/481, 483, 550, 651.01, 707

[56] References Cited

U.S. PATENT DOCUMENTS

| | | | |
|---|---|---|---|
| 3,940,679 | 2/1976 | Brandwein et al. | 320/48 |
| 4,316,185 | 2/1982 | Watrou et al. | 340/636 |
| 4,424,491 | 1/1984 | Bobbett et al. | 324/433 |
| 4,823,086 | 4/1989 | Whitmire et al. | 324/433 |
| 5,406,266 | 4/1995 | Mino et al. | 340/636 |
| 5,525,890 | 6/1996 | Iwatsu et al. | 320/48 X |
| 5,539,318 | 7/1996 | Sasaki | 324/428 |

*Primary Examiner*—Ernest F. Karlsen
*Assistant Examiner*—Diep Do
*Attorney, Agent, or Firm*—Panitch Schwarze Jacobs & Nadel, P.C.

[57] ABSTRACT

In a method of detecting deterioration of a battery pack consisting of a series assembly of a plurality of battery modules during charging, on the basis of a voltage difference between a plurality of battery modules, deterioration detection is inhibited until a predetermined capacity is charged after starting of the charge. Also, in a detection apparatus for deterioration in a battery pack according to the present invention, a deterioration reference discharge voltage value which should correspond to a discharge current value and a temperature value is calculated on the basis of reference data, and the deterioration reference discharge voltage value is compared with an actual discharge voltage value to judge whether deterioration occurs or not.

4 Claims, 6 Drawing Sheets

1 : Battery pack
2 : Temperature sensor
3 : Current sensor
4 : Voltage sensor
7 : A/D converter
10: Deterioration detection circuit
11: Display device
101~124: Modules

APPARATUS FOR DETECTING BATTERY PACK DETERIORATION DURING DISCHARGE MODE AND METHOD FOR INHIBITING DETERIORATION DETECTION OF A SIGNIFICANTLY DRAINED BATTERY PACK DURING CHARGING MODE

BACKGROUND OF THE INVENTION

1. Field of the Invention

The present invention relates to a method and apparatus for detecting a state of a storage battery in the form of a battery pack consisting of an assembly of sealed-type nickel-metal hydride batteries or the like (for example, whether the storage battery deteriorates and comes to the time of replacement), particularly of a storage battery which is to be installed in a movable body such as an electric vehicle.

2. Description of the Prior Art

As a power source which is installed in a movable body such as an electric vehicle or a battery-driven industrial vehicle, conventionally, liquid type lead storage batteries in the form of a battery pack are usually used. Detection as to whether the battery pack deteriorates and comes to the time of replacement is conducted by measuring differences or so-called unevenness in voltage of unit cells constituting the battery pack during the continuous charging. For example, Japanese patent publication TOKKAI HEI 5-236,662 discloses a system for a battery pack consisting of a plurality of blocks wherein when a difference between mean voltages per one cell in each block reaches 0.05 V or higher, the battery pack is judged as being abnormal.

A sealed-type nickel-metal hydride battery, which is superior to a lead storage battery in basic properties such as an energy density, an output density and a life cycle, receives attention as a power source of a movable body such as an electric vehicle and is under development for practical use. When a sealed-type nickel-metal hydride battery is to be used in an electric vehicle, a battery capacity and a total voltage are required to be 50 to 120 Ah and about 100 to 350 V, respectively, to obtain a predetermined output. In the nickel-metal hydride battery, since an output voltage of one cell which is the minimum unit in a practical use is about 1.2 V, a number of cells are connected in series so as to obtain a required total voltage. For example, when 10 cells are connected in series to constitute 1 module and 24 modules are connected in series, a battery pack of 24 cells is formed and a total voltage of 288 V is obtained.

However, it was found that, even when the battery pack of sealed-type nickel-metal hydride battery for an electric vehicle in which a very large number of cells are assembled as described above is subjected to a deterioration detection method which is applied to the conventional lead battery and based on unevenness of voltage, it is impossible to conduct correct detection. This is because values of voltage of the cells at the start of charge have unevenness originated in discharge of the previous cycle and such unevenness is produced even in a normal battery, thereby making an erroneous judgment.

On the other hand, power performance of an electric vehicle depends on the output of battery pack during a discharge, and therefore the output during the discharge is practically important as one of deterioration detection criterion of a battery pack. In the prior art, however, there is no method and apparatus for detecting the reduction of the output.

OBJECT AND SUMMARY OF THE INVENTION

The present invention has been realized in order to solve the above-mentioned problems, and it is an object of the invention to offer a detection method and apparatus for deterioration in a battery pack which can correctly detect deterioration of a battery pack with an accuracy responsive to the actual output.

In order to attain the object, the detection method for deterioration in a battery pack according to the present invention is characterized by a method of detecting deterioration of a battery pack consisting of a series assembly of a plurality of battery modules by detecting a voltage difference between the plurality of battery modules during charging, wherein a deterioration detection is inhibited until a predetermined capacity is charged after starting of charge.

According to this method, after the start of charge, the deterioration detection is inhibited until the battery pack is charged to the predetermined capacity. Therefore, unevenness of voltage in the initial stage of the charge which is caused by the difference in depth of discharge among the unit cells is not erroneously detected as a deterioration of the battery.

Also, the detection apparatus for deterioration in a battery pack according to the present invention comprises:

current detection means for detecting a discharge current of the battery pack; voltage detection means for detecting a discharge voltage of the battery pack; temperature detection means for detecting a battery temperature of the battery pack; storage means for previously storing reference data which are obtained by actually measuring a discharge voltage of a deteriorated test battery pack with a battery temperature value and a discharge current value of the test battery pack being used as variables; calculation means for calculating a deterioration reference discharge voltage value, which is to correspond to the discharge current value detected by the current detection means and the temperature value detected by the temperature detection means, by referring to said reference data; deterioration judging means for comparing the deterioration reference discharge voltage value with the discharge voltage value detected by the voltage detection means to judge whether deterioration occurs or not; and display means for receiving an output of the deterioration judging means to display the output.

In the thus composed detection apparatus for deterioration in a battery pack, the calculation means calculates on the basis of the reference data the deterioration reference discharge voltage value which should correspond to the discharge current value detected by the current detection means and the temperature value detected by the temperature detection means, and the deterioration judging means compares the deterioration reference discharge voltage value with the discharge voltage value detected by the voltage detection means and judges whether the battery pack is deteriorated or not, and therefore, it is possible to detect deterioration with fidelity to the actual output of an electric vehicle or the like.

The detection apparatus for deterioration in a battery pack according to another aspect of the present invention comprises:

storage means for previously storing reference data which are obtained by actually measuring a gradient of a distribution of a discharge voltage with respect to a discharge current of a deteriorated test battery pack with a battery temperature value of the test battery pack using as a variable; calculation means for calculating a gradient of a distribution of a plurality of discharge voltage values detected by the voltage detection means with respect to a plurality of corresponding discharge current values detected by the current detection means and for calculating on the basis of the reference data a deterioration reference gradient of distribution of the discharge voltage with respect to the discharge current which is to be held at the temperature value detected by the temperature detection means; deterioration judging means for comparing the gradient with the deterioration reference gradient to judge whether deterioration occurs or not; and display means for receiving an output of the deterioration judging means to display the output.

In this configuration, on the basis of the distribution of a plurality of discharge voltage values which are detected by the voltage detection means and corresponding to a plurality of discharge current values detected by the current detection means, the calculation means calculates the gradient of the distribution, and on the basis of the reference data, also calculates a deterioration reference gradient of a distribution of the discharge voltage with respect to the discharge current, the deterioration reference gradient being to correspond to the temperature value detected by the temperature detection means. The deterioration judging means compares the gradient with the deterioration reference gradient to judge whether the battery pack is deteriorated or not. Therefore, a deterioration state of the battery can be correctly detected without being affected by the remaining capacity of the battery.

The deterioration judging means may be composed so that the deterioration judgment on the basis of the gradient will be inhibited when the battery capacity of the battery pack is within a predetermined range, and thereby, the deterioration detection can be conducted only in a region where the linearity of the relationship between the voltage and the current is maintained, and therefore the reliability is improved.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENTS

Hereinafter, preferred embodiments of the invention will be described with reference to the accompanying drawings.

Figure 1:
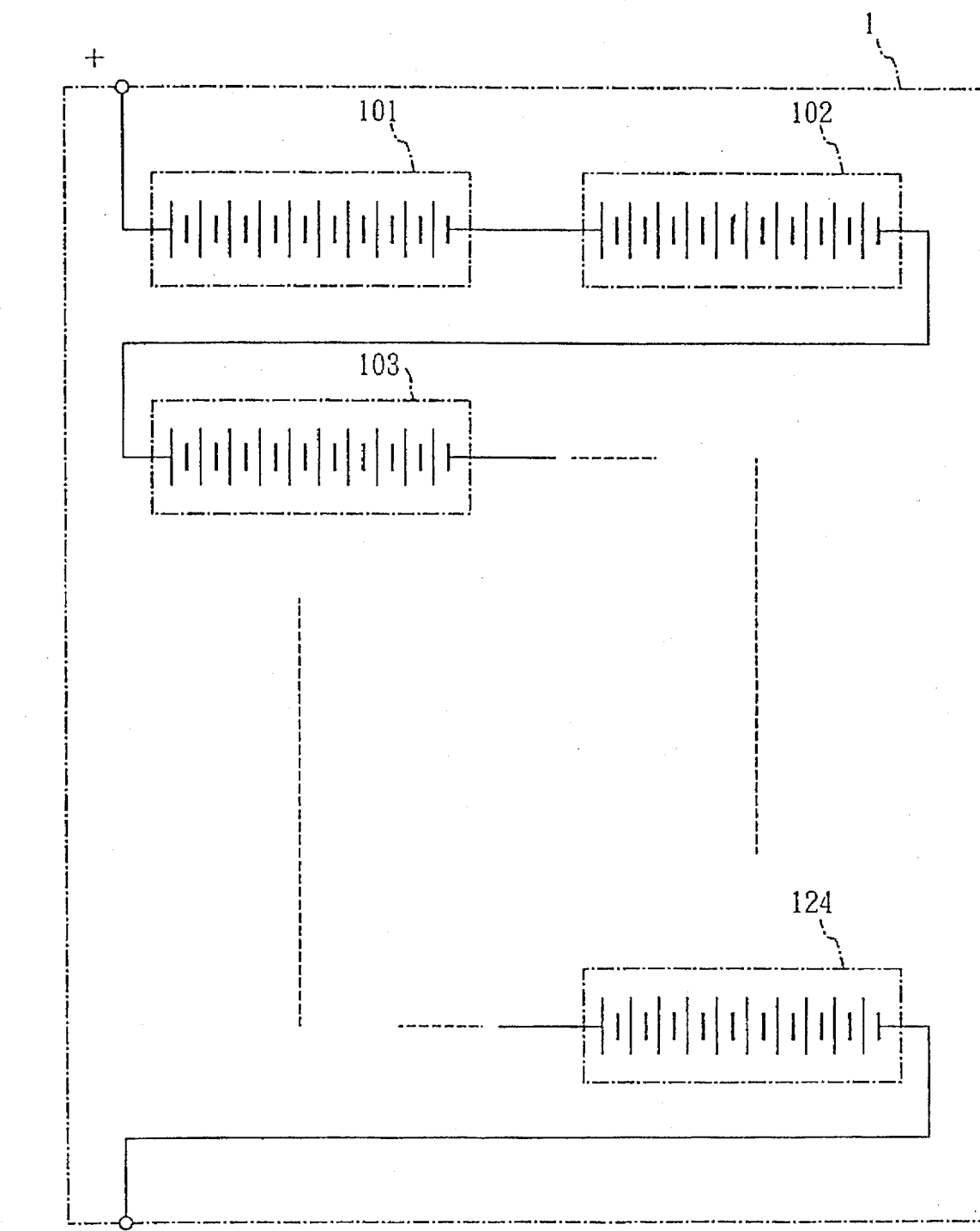
FIG. 1 is a diagram showing an internal circuit configuration of a battery pack.

FIG. 1 is an internal circuit diagram of a storage battery which is to be installed in a movable body such as an electric vehicle and consists of an assembly of sealed-type nickel-metal hydride batteries. The battery 1 is a battery pack (hereinafter, referred to as a battery pack 1) in which a plurality (in the embodiment, for example, 24) of modules 101, 102, 103, ..., and 124 are connected in series, and each of the modules consists of a series assembly of a plurality (usually, 10) of cells.

Figure 2:
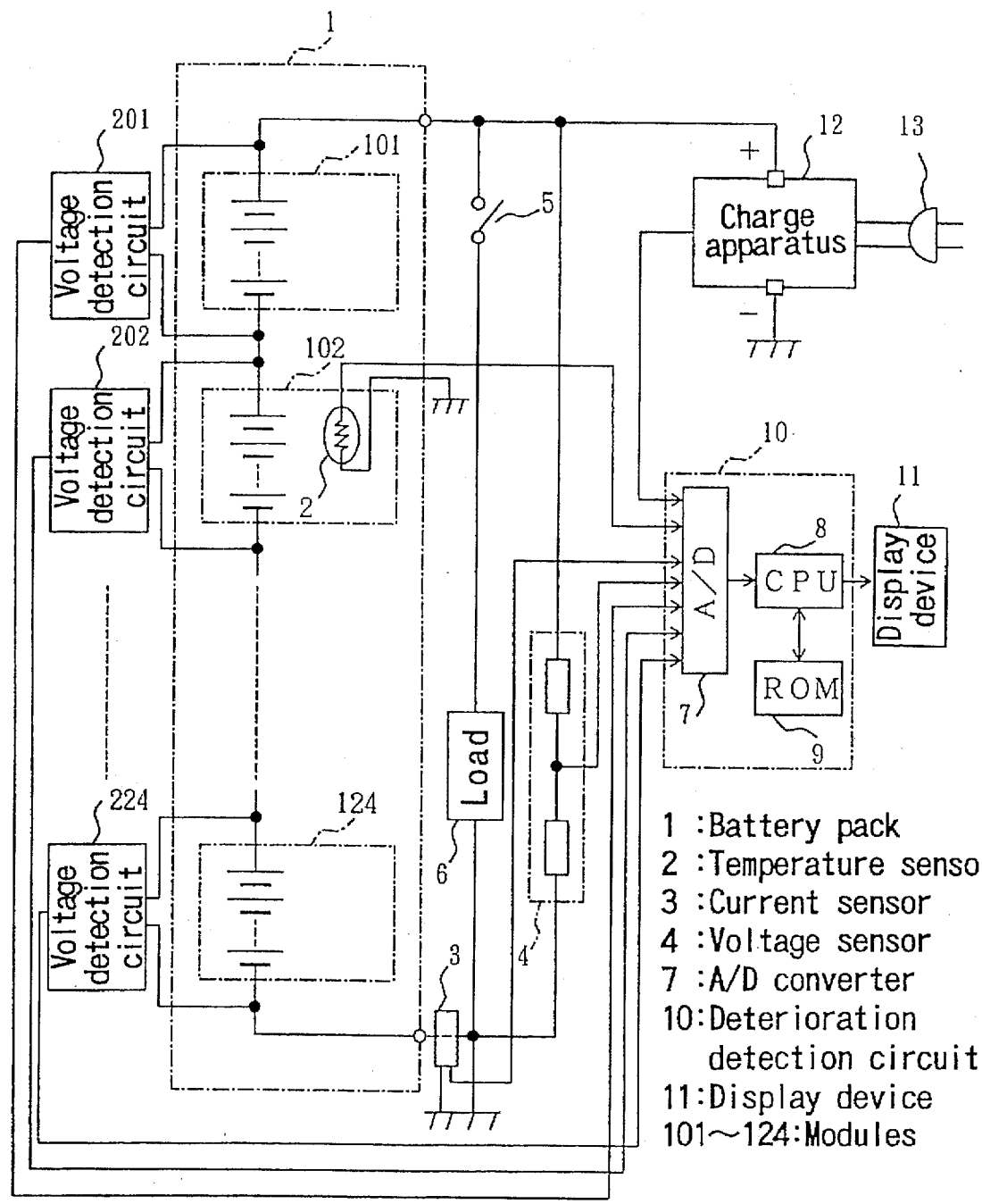
FIG. 2 is a circuit diagram showing a detection apparatus for deterioration in a battery pack of the present invention.

FIG. 2 is a diagram showing the a detection apparatus for deterioration in the battery pack 1 of the present invention. Referring to FIG. 2, pairs of input terminals of voltage detection circuits 201 to 224 are connected across the terminals of the modules 101 to 124, respectively, and analog voltage output signals which correspond to the respective voltages across the terminals of the modules 101 to 124 are input to an A/D converter 7.

A battery temperature sensor 2 is disposed in the module 102, and its output is sent to the A/D converter 7. In the embodiment, the battery temperature sensor 2 is, for example, a thermistor temperature sensor. Although the embodiment in which the battery temperature sensor 2 is disposed in the module 102 is shown, this configuration is a mere example, and the battery temperature sensor may be disposed in another module. Alternatively, the battery temperature sensor 2 may be disposed in two or more modules, and a CPU 8 may obtain a mean or maximum value of their outputs.

A charge apparatus 12 and a series circuit of a switch 5 and a load 6 are connected across the battery pack 1. The load 6 is a motor, etc. of an electric vehicle. Under a normal running state, the switch 5 is closed so that a current will be supplied to the load 6. During a charge, the switch 5 is opened to isolate the load 6 from the battery pack, and a DC charge voltage is applied to the battery pack by the charge apparatus 12. A plug 13 of the charge apparatus is connected to a power source of, for example, AC 200 V under a state in which the electric vehicle is stopped. During a period when the charge apparatus 12 is activated, a signal indicative of the activation is sent to the A/D converter 7. A current flowing through the load 6 is detected by a current sensor 3 such as a Hall element and then sent to the A/D converter 7. A voltage sensor 4, which employs, for example, potential division by resistance, is connected across the battery pack 1 and detects a voltage proportional to the voltage (total voltage) across the battery pack 1, to send a voltage signal to the A/D converter 7.

A digital output signal of the A/D converter 7 is sent to the CPU 8. A ROM 9 is connected to the CPU 8. The A/D converter 7, the CPU 8 and the ROM 9 constitute a deterioration detection circuit 10. An output of the CPU 8 is sent to a display device 11. The display device 11 is disposed at, for example, a position in the electric vehicle which is in front of the driver's seat, so that the driver can watch the display device.

Next operation of the above-mentioned embodiment will be described.

[Deterioration detection during charging]

Figure 3:
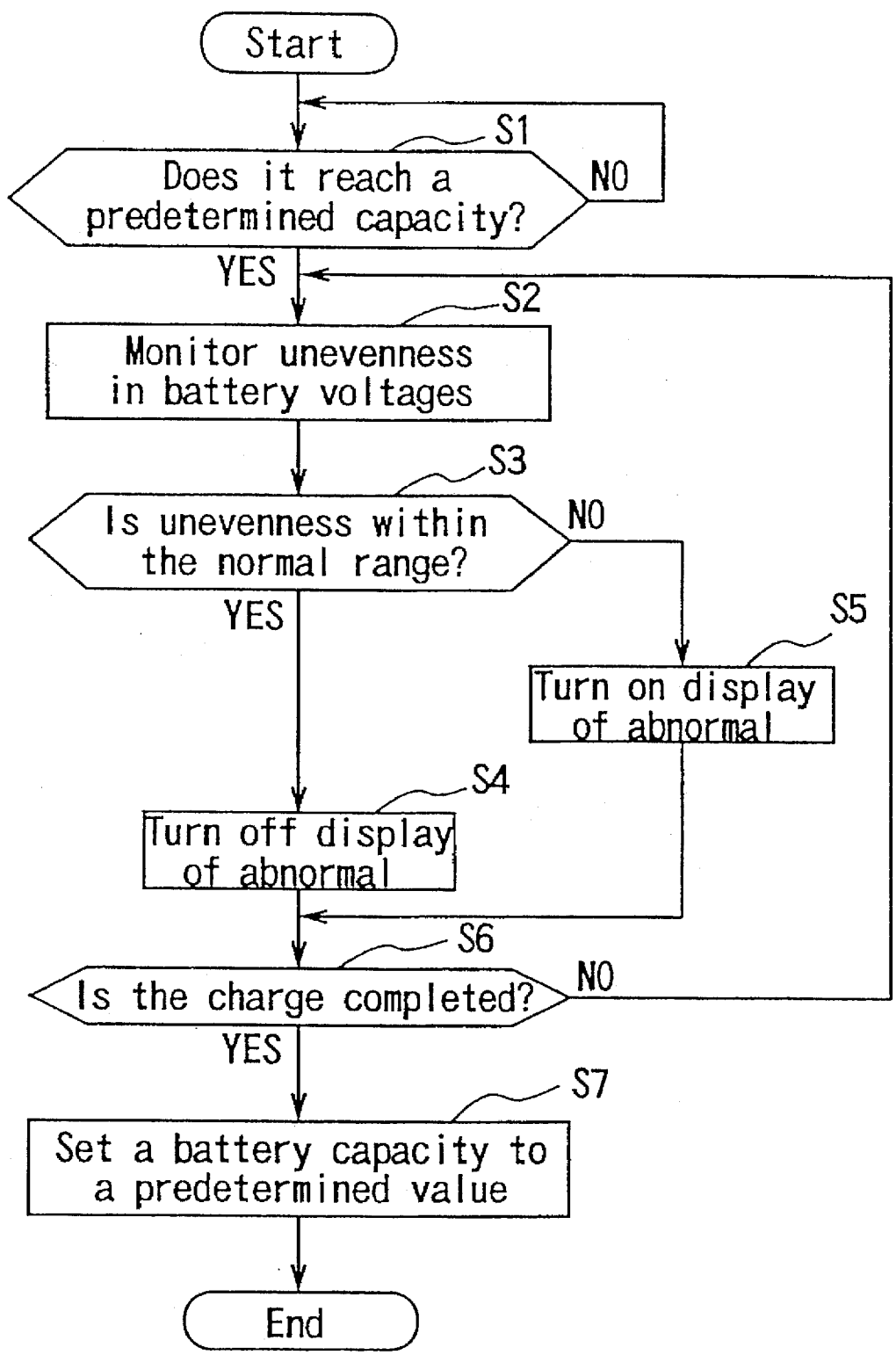
FIG. 3 is a flow chart showing a deterioration detection operation during a charge in the present invention.

At first, a deterioration detection operation for the battery pack 1 during a charge will be described. FIG. 3 is a flow chart showing an operation which is executed by the CPU 8 during a charge. Referring to FIG. 2, the switch 5 is opened to isolate the load 6 from the battery pack, and thereafter the plug 13 is connected to the power source to activate the charge apparatus 12. Upon receipt of an activation signal from the charge apparatus 12, the CPU 8 starts the execution of the flow chart of FIG. 3. First, based on the terminal voltage of the battery pack 1, it is judged in step S1 whether the battery pack 1 reaches a predetermined capacity as a result of the charge. Step S1 is repeated until the predetermined capacity is attained. In the embodiment, the predetermined capacity is set to be 10% of the battery capacity [A·h] of the battery pack 1 in full charge. Therefore, the process does not advance to the next step or waits until the battery pack is charged up to 10% of the battery capacity. During this period, therefore, the deterioration detection of the battery which is to be conducted in a subsequent step is not carried out. The reason why the deterioration detection of the battery is inhibited during a predetermined initial period of the charge will be described below.

As described above, the battery pack 1 is composed of the plurality of modules 101 to 124 (FIG. 2), and each of the modules 101 to 124 is composed of a number of cells. The battery pack 1 installed in an electric vehicle is frequently subjected to repetition of charge and discharge. In the battery pack 1 which has been used in this way, it is experimentally known that all the cells are not always discharged in the same manner and a depth of discharge, i.e., a degree of discharge is different depending on the cells. Therefore, there often occurs a case that: though there is no abnormality in the battery as a whole, voltages of the cells are different from each other in the initial stage of the charge and voltages of the modules 101 to 124 are not even. It is not adequate to recognize the state as the existence of "unevenness of voltage" and judge that a module of a lower voltage among the modules is deteriorated. This is because a normal cell thereafter smoothly recovers its voltage. Consequently, it is preferable not to conduct the deterioration detection during a predetermined period in the initial stage of the charge.

Returning to FIG. 3, when the predetermined capacity is attained, unevenness in voltage is monitored in step S2, and it is judged in step S3 whether the unevenness is within a normal range or not. Specifically, the voltage signals sent from the voltage detection circuits 201 to 224 of FIG. 2 are compared with each other to obtain a voltage per one cell, and when the difference of the voltage among the modules is less than a predetermined value, it reaches a judgment of "normal". If normal, the process proceeds to step S4, so that the display of abnormality is turned off, and then advances to step S6.

If it reaches a judgment of "abnormal" in step S3, the process proceeds to step S5 in which the display of abnormality is turned on. Specifically, the CPU 8 of FIG. 2 sends an abnormality display signal to the display device 11. The abnormality display signal may include a signal indicative of which module of the modules 101 to 124 has an abnormal voltage, in addition to a signal which merely indicates the existence of abnormality.

If it is judged in step S6 that the charge is completed, the process proceeds to step S7; and if the charge is not completed, the process returns to step S2 and the above-described operation is repeated. In step S7, data of the battery capacity is set to be a predetermined value. For example, the predetermined value is 100 (%). The above is the deterioration detection operation during the charge.

After the vehicle starts to run, the CPU 8 integrates a load current detected by the current sensor 3 for each unit time and obtains an amount of consumption of the battery capacity. Further, it is continuously executed that a value corresponding to the amount of consumption is subtracted from the predetermined value (100) of the battery capacity after the charge. In this way, the state of the battery capacity after the completion of the charge is always grasped.

[Deterioration detection (1) during running]

Figure 4:
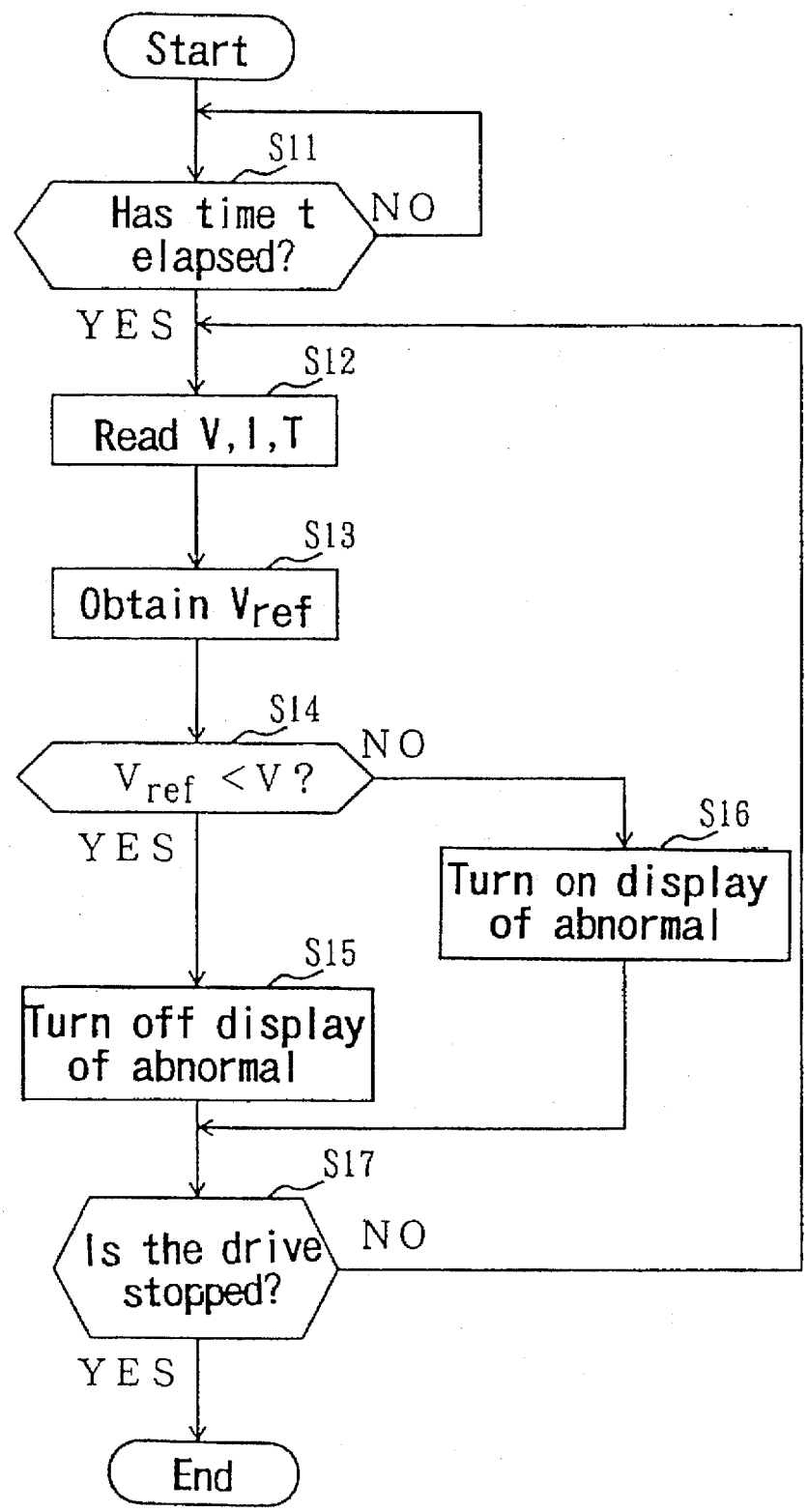
FIG. 4 is a flow chart showing a deterioration detection operation during a discharge in the present invention.

Next, the deterioration detection operation for the battery pack 1 during the running of the electric vehicle will be described. FIG. 4 is a flow chart showing an operation which is executed by the CPU 8 after the electric vehicle starts to run. Prior to the description of the operation, preparation of the deterioration criterion used in the operation flow will be described. In the operation flow, the deterioration of the battery is to be detected. Therefore, the reference on which the battery is judged to be deteriorated (the battery life is judged to reach the end) is required. To comply with this, when the initial battery capacity of a fresh battery pack is set to be 100, and the state where the battery capacity is lowered to 80 is defined as the "deterioration" (expiration of the life) of a battery. In other words, it means that the battery enters the state where a capacity which is 80% of the initial battery capacity is obtained at the maximum however long the battery is charged. This "deterioration" includes a state that the battery naturally reaches its end as a result of repetition of normal charge and discharge, and also a state of sudden occurrence of an apparent failure.

An experiment is conducted in a way that a battery of an 80% battery-capacity is discharged at a constant current while maintaining the battery temperature at a constant level and a discharge voltage (the terminal voltage of the battery pack 1 during a discharge) which is stabilized and after a lapse of a predetermined time (e.g., after 10 seconds) is measured. Results which were obtained by measuring the discharge voltage while variously changing the battery temperature and the discharge current as variables are listed in Table 1. These results are stored in the ROM 9 (FIG. 2).

TABLE 1

Discharge voltage [V] with respect to various battery temperatures and various discharge currents

| Battery temperature | Discharge current | | | |
|---|---|---|---|---|
| | 20A | 100A | 200A | 300A |
| −20° C. | 295 | 256 | 208.2 | 160 |
| 0° C. | 300 | 265.7 | 222.9 | 180 |
| 20° C. | 307 | 268.8 | 233 | 192 |
| 40° C. | 310 | 277.7 | 237 | 197 |
| 60° C. | 313 | 283 | 242 | 202 |

Referring to FIG. 4, when the electric vehicle starts to run, the process proceeds to step S11 and waits therein a lapse of a time t. For example, the value of t is 10 seconds. This is because the state of the battery is not stable in a period when 10 seconds has not yet elapsed after the start of running. When the time t has elapsed, the process proceeds to step S12 to read a discharge voltage V, a discharge current I and a battery temperature T. During the running of the electric vehicle, the discharge voltage V and the discharge current I continue to vigorously change, and therefore, the operation of reading the two values is conducted sequentially in the execution of the CPU 8 so that the simultaneousness of the readings, i.e., the reliability of the readings is enhanced. The process then proceeds to step S13, and a deterioration reference discharge voltage $V_{ref}$ which is to function as the criterion of deterioration is obtained from the data of Table 1 based on the discharge current I and the battery temperature. Since the data stored in the ROM 9 are finite, the discharge voltage is obtained by interpolation. When the battery temperature T is 30° C. and the discharge current I is 150 A, for example, the discharge voltage data at 20° C. (the row direction of Table 1) and the discharge voltage data at 40° C. are interpolated, thereby obtaining discharge voltage data at 30° C. Next, the discharge voltage data at 30° C. and 150 A is obtained by interpolating the data at 100 A and data at 200 A among the obtained discharge voltage data at 30° C. The thus obtained discharge voltage is used as the deterioration reference discharge voltage $V_{ref}$.

Next, the deterioration reference discharge voltage $V_{ref}$ is compared in step S14 with the actual discharge voltage V, and if the relationship of (deterioration reference discharge voltage $V_{ref}$)<(discharge voltage V) is held, it is judged that the battery is normal, and thereby the process proceeds to step S15; if the relationship is not held, it is judged that the battery is abnormal, and the process then proceeds to step S16. In step S15, the display of abnormality is turned off, and then the process advances to step S17. In step S16, the display of abnormality is turned on. Specifically, the CPU 8 in FIG. 2 sends the signal to the display device 11, and the display device 11 makes a display indicative of deterioration of the battery pack 1. It is judged in step S17 whether the running is stopped or not, and if the running is continued, the process returns to step S12 and the above-described operation is repeated. If the running is stopped by, for example, turning the ignition key to the off position, the operation is terminated.

In this way, on the basis of the discharge current and the battery temperature in the actual running of the electric vehicle, it is judged that the discharge voltage reaches the reference value of deterioration or not, thereby conducting the detection of deterioration. The discharge power, which is a product of the discharge current and the discharge voltage, corresponds to the output of the electric vehicle, and consequently, it is possible to detect deterioration with fidelity to the actual output of the electric vehicle.

[Deterioration detection (2) during running]

Hereinafter, a configuration in which deterioration of the battery pack is detected in a view point different from the above-described deterioration detection (1) during running will be described. The discharge voltage (terminal voltage) V and the discharge current I of the battery pack 1 shown in FIG. 1 have the following mutual relationship:

$$V=(-a \cdot I+b) \times 24 \qquad (1),$$

wherein "a" and "b" are constants. When numerals are substituted as an example, expression (1) becomes $$V=(-0.012032 \times I+12.5605) \times 24.$$

Hereat, "a" corresponds to an internal resistance of each module and b to the terminal voltage of the module at no load. The value of "a" is unaffected by the remaining amount of the battery capacity but not always constant or increases as the fatigue of the battery (progress of deterioration) advances. Therefore, deterioration of the battery can be detected by monitoring the value of "a".

Figure 5:
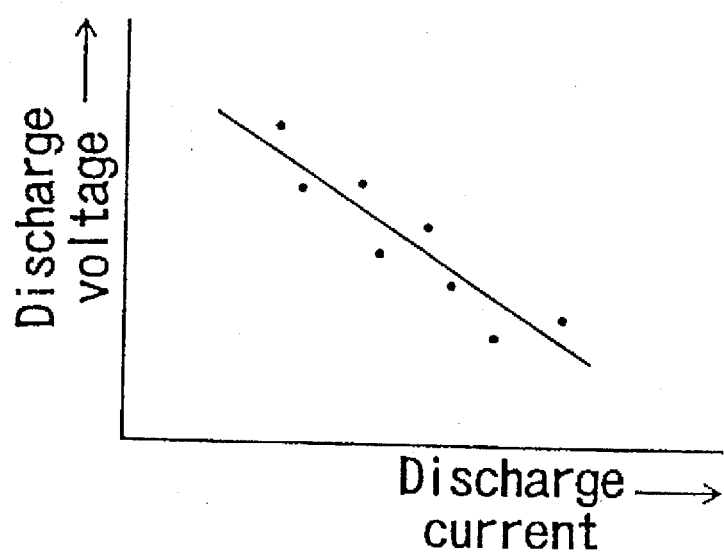
FIG. 5 is a graph showing a relationship between a discharge current and a discharge voltage.

Accordingly, in the same manner as above-described deterioration detection (1), a battery pack in which the battery capacity is deteriorated to 80% is prepared, and the discharge voltage and the discharge current are measured at predetermined battery temperatures. In the measurement, in order to increase the reliability of data, it is preferable to conduct the measurement within a predetermined time (for example, 10 minutes) and a predetermined amount of a discharge current (for example, 3 Ah). Then the measurement is conducted while variously changing the battery temperature, and data of the discharge voltage and the discharge current are prepared with respect to the battery temperature used as a variable. FIG. 5 shows an example in which all measuring points for one battery temperature are plotted. It is possible to analogize a line shown in the figure from the plots. A gradient of the line is "a". According to the regression analysis, the gradient "a" is given by the following expression:

$$a=\{\Sigma(Ii-Im)(Vi-Vm)\}/\Sigma(Ii-Im)^2 \qquad (2),$$

wherein Ii and Vi are measured values of the discharge current and discharge voltage, respectively, and Im and Vm are mean values of the discharge current and discharge voltage, respectively.

In this way, the gradients of the lines at various battery temperatures are checked, so that data listed in Table 2 shown in the following are obtained. The data are stored in the ROM 9 (FIG. 2).

TABLE 2

| Gradient of discharge voltage with respect to discharge current at various battery temperatures | | | | | | | |
|---|---|---|---|---|---|---|---|
| Battery temp. | −20° C. | 0° C. | 10° C. | 20° C. | 30° C. | 40° C. | 50° C. |
| Gradient | 0.80 | 0.70 | 0.60 | 0.50 | 0.45 | 0.42 | 0.40 |

Figure 6:
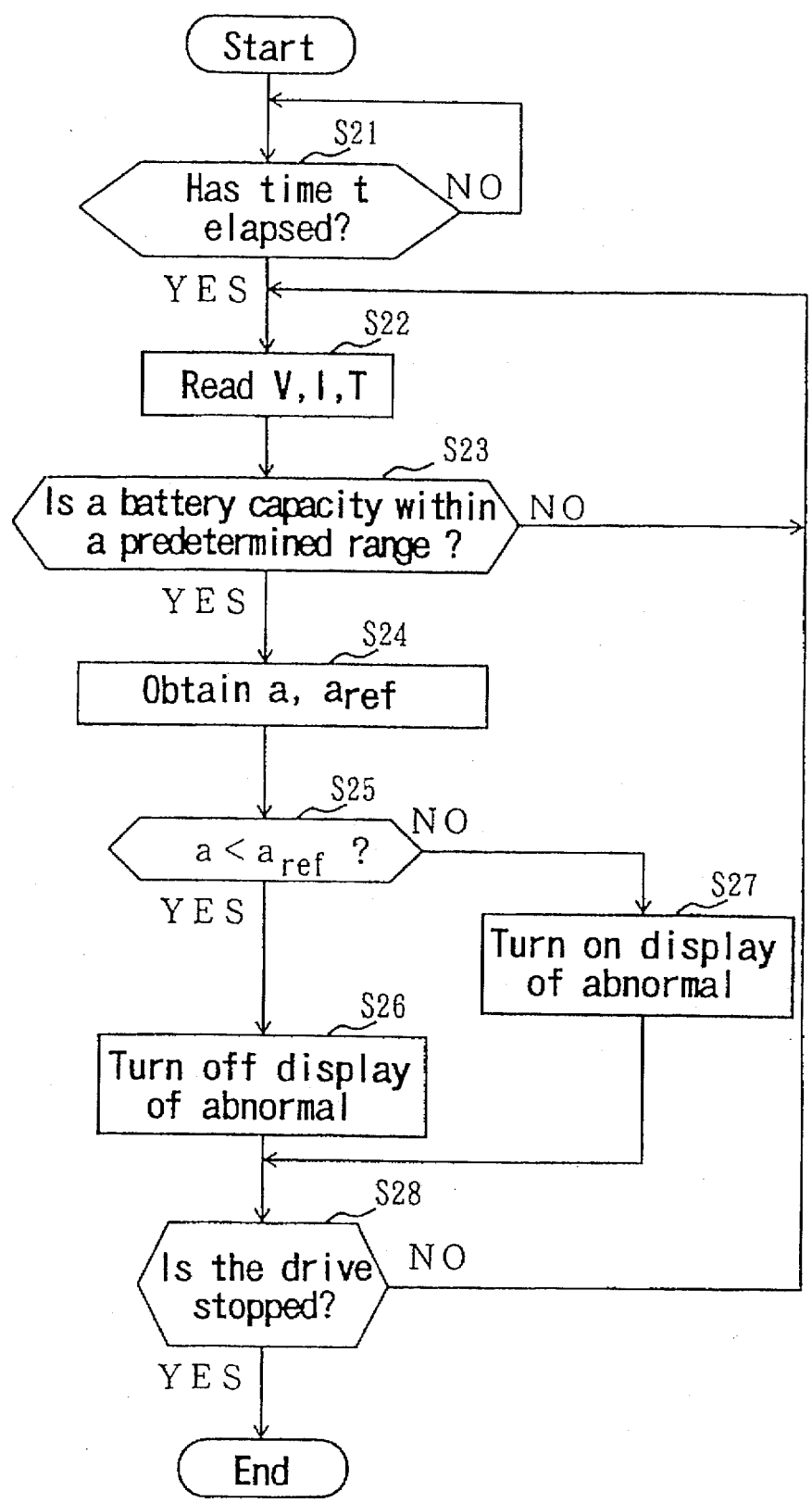
FIG. 6 is a flow chart showing another deterioration detection operation during a discharge in the present invention.

FIG. 6 is a flow chart showing the operation configuration of the above-described deterioration detection (2). Referring to FIG. 6, when the electric vehicle starts to run, the process proceeds to step S21 and waits therein a lapse of the time t. For example, the value of t is 10 seconds as described above. When the time t has elapsed, the process proceeds to step S22 to read the discharge voltage V, the discharge current I and the battery temperature T. The discharge voltage V and the discharge current I are repeatedly read at every predetermined periods so that discharge voltages Vi and discharge currents Ii will be collected as plural data.

Next it is judged in step S23 whether the present battery capacity is within a predetermined range or not with respect to a state of immediately after the completion of the charge which is set to be 100 (%). For example, the predetermined range is 20 to 80%. Therefore, if the battery capacity is greater than 80% or smaller than 20%, the process returns to step S22. If the battery capacity is within the range of 20 to 80%, the process proceeds to next step S24. This restriction to the predetermined range is conducted in order to improve the accuracy of the detection. That is, in the case where the battery capacity [A·h] is greater than 80% or it is smaller than 20%, the linear relationship between the voltage and the current is not established and the measurement error is large, and therefore deterioration cannot be accurately detected.

The process then proceeds to step S24, and the gradient "a" of the discharge voltage with respect to the discharge current is obtained from the above-mentioned expression (2). Further, the deterioration reference gradient $a_{ref}$ is obtained from the data of Table 2 on the basis of the battery temperature T. Since the data stored in the ROM 9 are finite, the deterioration reference gradient $a_{ref}$ is obtained by interpolation. When the battery temperature T is 25° C., for example, the gradient of 0.5 at 20° C. and the gradient of 0.45 at 30° C. are interpolated, thereby obtaining the gradient at 25° C. The obtained gradient is used as the deterioration reference gradient $a_{ref}$.

Next, the deterioration reference gradient $a_{ref}$ is compared in step S25 with the actual gradient "a". If the relationship of (gradient a)<(deterioration reference gradient $a_{ref}$) is held, it is judged that the battery is normal, and the process then proceeds to step S26; and if the relationship is not held, it is judged that the battery is abnormal, and the process then proceeds to step S27. In step S26, the display of abnormality is turned off, and then the process advances to step S28. In step S27, the display of abnormality is turned on. Specifically, the CPU 8 in FIG. 2 sends a signal to the display device 11, and the display device 11 makes a display indicative of deterioration of the battery pack 1. It is judged in step S28 whether the running is stopped or not, and if the running is continued, the process returns to step S22 and the above-described operation is repeated. If the running is stopped by, for example, turning the ignition key to the off position, the operation is terminated.

In this way, it is judged whether the gradient of the distribution of the discharge voltage with respect to the discharge current during the actual running of the electric vehicle reaches the reference value of deterioration or not, thereby conducting the detection of deterioration of the battery.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A detection apparatus for deterioration in a battery pack consisting of a series assembly of a plurality of battery modules during discharging, said apparatus comprising:

current detection means for detecting a discharge current of said battery pack;

voltage detection means for detecting a discharge voltage of said battery pack;

temperature detection means for detecting a battery temperature of said battery pack;

storage means for previously storing reference data which are obtained by actually measuring a discharge voltage of a deteriorated test battery pack with a battery temperature value and a discharge current value of said test battery pack being used as variables;

calculation means for calculating a deterioration reference discharge voltage value, which is to correspond to the discharge current value detected by said current detection means and the temperature value detected by said temperature detection means, by referring to said reference data;

deterioration judging means for comparing said deterioration reference discharge voltage value with the discharge voltage value detected by said voltage detection means to judge whether deterioration occurs or not; and display means for receiving an output of said deterioration judging means to display the output.

2. A detection apparatus for deterioration in a battery pack consisting of a series assembly of a plurality of battery modules during discharging, said apparatus comprising:

current detection means for detecting a discharge current of said battery pack;

voltage detection means for detecting a discharge voltage of said battery pack;

temperature detection means for detecting a battery temperature of said battery pack;

storage means for previously storing reference data which are obtained by actually measuring a gradient of a distribution of a discharge voltage with respect to a discharge current in a deteriorated test battery pack with a battery temperature value of said test battery pack using as a variable;

calculation means for calculating a gradient of a distribution of a plurality of discharge voltage values detected by said voltage detection means with respect to a plurality of corresponding discharge current values detected by said current detection means and for calculating on the basis of said reference data a deterioration reference gradient of distribution of the discharge voltage with respect to the discharge current which is to be held at the temperature value detected by said temperature detection means;

deterioration judging means for comparing said gradient with said deterioration reference gradient to judge whether deterioration occurs or not; and display means for receiving an output of said deterioration judging means to display the output.

3. A detection apparatus for deterioration in a battery pack according to claim 2 wherein, when a capacity of said battery pack is within a predetermined range, a judgment on whether deterioration occurs or not is inhibited.

4. A method for detecting deterioration of a battery pack having a series assembly of a plurality of battery modules during a charging mode by detecting a difference of voltages among the plurality of battery modules, the method comprising the steps of:

(a) measuring capacity of the battery pack upon initiation of the charging mode, the battery pack having a known full charge capacity; and (b) inhibiting the deterioration detection until the battery pack capacity reaches a predetermined percentage of the full charge capacity.

* * * * *